United States Patent [19]

Karim et al.

[11] Patent Number: 4,589,401
[45] Date of Patent: May 20, 1986

[54] INJECTOR DRIVER FAULT DETECT AND PROTECTION DEVICE

[75] Inventors: Frank Karim, Hanover Park; Howard L. Frank, Skokie; Nicholas C. Hopman, Roselle, all of Ill.

[73] Assignee: Motorola, Inc., Schaumburg, Ill.

[21] Appl. No.: 722,534

[22] Filed: Apr. 12, 1985

[51] Int. Cl.⁴ .............................................. F02P 5/08
[52] U.S. Cl. .................... 123/479; 123/490; 361/152
[58] Field of Search ............ 123/479, 490; 361/152, 361/154, 160, 93, 98, 101

[56] References Cited

U.S. PATENT DOCUMENTS

| | | | |
|---|---|---|---|
| 4,287,565 | 9/1981 | Haubner | 123/479 |
| 4,310,889 | 1/1982 | Imai | 123/479 |
| 4,375,073 | 2/1983 | Glogolja | 361/101 |
| 4,375,074 | 2/1983 | Glogolja | 361/101 |
| 4,471,739 | 9/1984 | Vamoto | 123/490 |
| 4,541,386 | 9/1985 | Kishi | 123/479 |

*Primary Examiner*—Ronald B. Cox

*Attorney, Agent, or Firm*—Donald B. Southard; Steven G. Parmelee

[57] ABSTRACT

An injector driver fault detect and protection device for use with fuel injection systems that include at least one solenoid (17) for controlling a fuel injection valve, control means for providing a control signal, injector driver means (14) responsive to the control signal for providing a drive signal, and a current control switch (16) being responsive to the drive signal for selectively closing and opening a power line that includes the solenoid (17) to thereby control the fuel injection valve. The device includes a fault detect and protection unit that receives current sense information regarding the flow of current through the solenoid (17), control signals from the control unit (13), and engine rotation data in the form of CAM degrees from a CAM position sense unit (19). Based upon this information, the fault detect and protection unit (11) can provide a fault protect signal to a fault control switch (12) to open circuit the solenoid (17) under specific fault conditions, and to provide a fault data signal under other fault conditions, as appropriate.

19 Claims, 7 Drawing Figures

INJECTOR DRIVER FAULT DETECT AND PROTECTION DEVICE

TECHNICAL FIELD

This invention relates generally to electronically controlled fuel injection systems as used to control fuel delivery to an internal combustion engine.

BACKGROUND ART

Internal combustion engines typically require oxygen, fuel and a sufficient temperature in order to support combustion. The forces released through such combustion are then typically harnessed to perform work, such as powering an automobile.

In general, such systems typically utilize liquid fuels, such as gasoline. These systems incorporate a liquid fuel delivery system to provide adequate quantities of fuel to the situs of combustion. One such fuel delivery system makes use of fuel injection valves that allow a predetermined quantity of fuel to be injected into the combustion chamber. By appropriate control of the fuel injection valve, both the time of injection and the quantity of fuel injected can be controlled.

Many such fuel injection systems are electronically controlled. These systems typically have one or more fuel injection valves that are solenoid controlled. These solenoids are controlled by drive units, which can be controlled by a control unit. The control unit will often control many such drive units (and hence fuel injection valves) based upon information regarding current engine operating parameters and operator commands. Through use of such a system, both the time of injection and the quantity of fuel injected can be carefully controlled and performance of the engine optimized.

There are, however, certain problems associated with such systems. For instance, under certain fault conditions, the fuel injection valve solenoid may remain on or off in an uncontrolled manner. The former condition can result if either the control signal from the control unit faults "on" or if some other fault occurs in the system that holds the solenoid on. The "off" condition can result if the control signal from the control unit faults "off," or if some other fault occurs in the system to uncontrollably deprive the solenoid of operating current.

If the solenoid becomes uncontrollably deprived of operating current, the problem essentially becomes one of maintenance. The operation of the engine in question will likely be impaired, and appropriate maintenance must be provided to ensure optimum performance. If the solenoid faults "on", however, a more dangerous circumstance can arise. In addition to impaired engine performance, an uncontrolled delivery of fuel to the engine can result in a perilous condition that poses risk to both the engine and its physical surroundings.

There therefore exists a need for a fault detect device that can detect when a fuel injection solenoid faults "on" or "off". Such a device should provide some form of fault protection upon detecting that the solenoid has faulted "on" in order to alleviate the risk associated with that particular fault condition. Also, such a device should provide fault data regarding the existence of an "off" fault condition, so that appropriate maintenance can be provided in a timely fashion.

SUMMARY OF INVENTION

The above needs are substantially met by provision of the injector driver fault detect and protection device described in this specification. This device may be applied in conjunction with an electronically controlled fuel injection system having at least one fuel injection valve that can be controlled by a solenoid, a switch that can control the supply of current to the solenoid, an injector driver unit that controls the switch through provision of a drive signal, and a control unit that controls the injector driver unit through provision of a control signal.

The device comprising the invention includes generally a current sense unit, a fault detect and protection unit, and a fault control switch.

The current sense unit may be comprised of a current sensing resistor positioned in series with the solenoid. The voltage developed across the resistor will be proportional to the current flowing through the solenoid. This voltage can then be fed back to the fault detect and protection unit. In many fuel injection systems, this current sense signal will also be fed back to the injector driver unit, such that during normal functioning, the injector driver unit can optimize the flow of current through the solenoid to ensure maximum performance.

The fault detect and protection unit receives the current sense signal issued by the current sense unit, the control signal generated by the control unit, and engine revolution data regarding the operation of the engine. In general, the latter signal can be related to CAM degrees as sensed through a CAM position sense unit. Based upon this information, the fault detect and protection unit can provide a fault control signal or a fault data signal as appropriate under the circumstances.

The fault control switch responds to the presence of a fault control signal to deprive the solenoid of current, regardless of the presence or absence of a control signal. The fault data signal, on the other hand, does not activate the fault control switch and can be transmitted or retained as necessary for diagnostic and maintenance purposes.

During typical operation, the fault detect and protection unit will provide a fault control signal when either of two conditions exist. First, the signal will be provided if the unit detects that current flows through the solenoid in the absence of a control signal. In addition, the fault control signal will be provided if the control signal has been "on" beyond a preselected maximum period as measured in CAM degrees.

The fault data signal will also be provided when either of two conditions exist. The fault data signal will be provided if the unit detects an absence of solenoid current in the presence of a control signal, and also if the unit detects that the control signal has been absent for too long a duration as measured in CAM degrees.

Therefore, through use of this device, an electronically controlled fuel injection system can be enhanced to provide appropriate maintenance information and safety precautions as appropriate.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein.

BEST MODE FOR CARRYING OUT THE INVENTION

Figure 1:
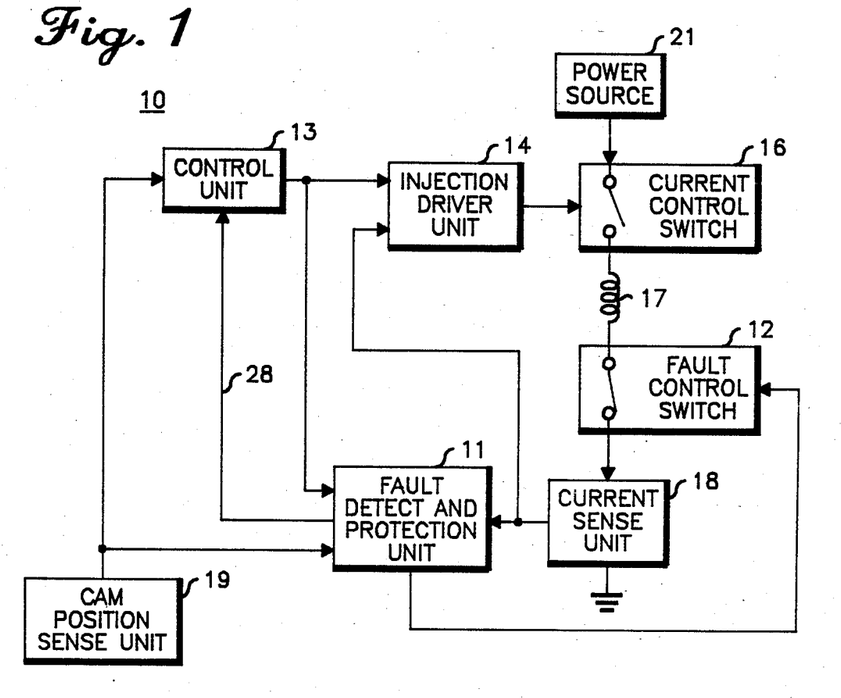
FIG. 1 comprises a general block diagram view of the device as configured in conjunction with a typical electronically controlled fuel injection system.

Referring now to the drawings, and in particular to FIG. 1, the device can be seen as depicted generally by the numeral 10. The device (10) includes generally a fault detect and protection unit (11), a fault control switch (12), and a current sense unit (18). In this particular embodiment, the device (10) operates in conjunction with a control unit (13), an injector driver unit (14), a current control switch (16), an injector driver solenoid (17), a CAM position sense unit (19), and a power source (21). Control units, injector driver units, current control switches, injector solenoids, CAM position sense units, and power sources are well known in the art and could be provided for herein through use of any of a variety of components and systems. Therefore, no more detailed description or explanation need be set forth here.

It may be helpful to note at the outset that both the control unit (13) and the fault detect and protection unit (11) receive CAM position signals from the CAM position sense unit (19), and that both the injector driver unit (14) and the fault detect and protection unit (11) can receive current sense signals from the current sense unit (18).

Figure 2:
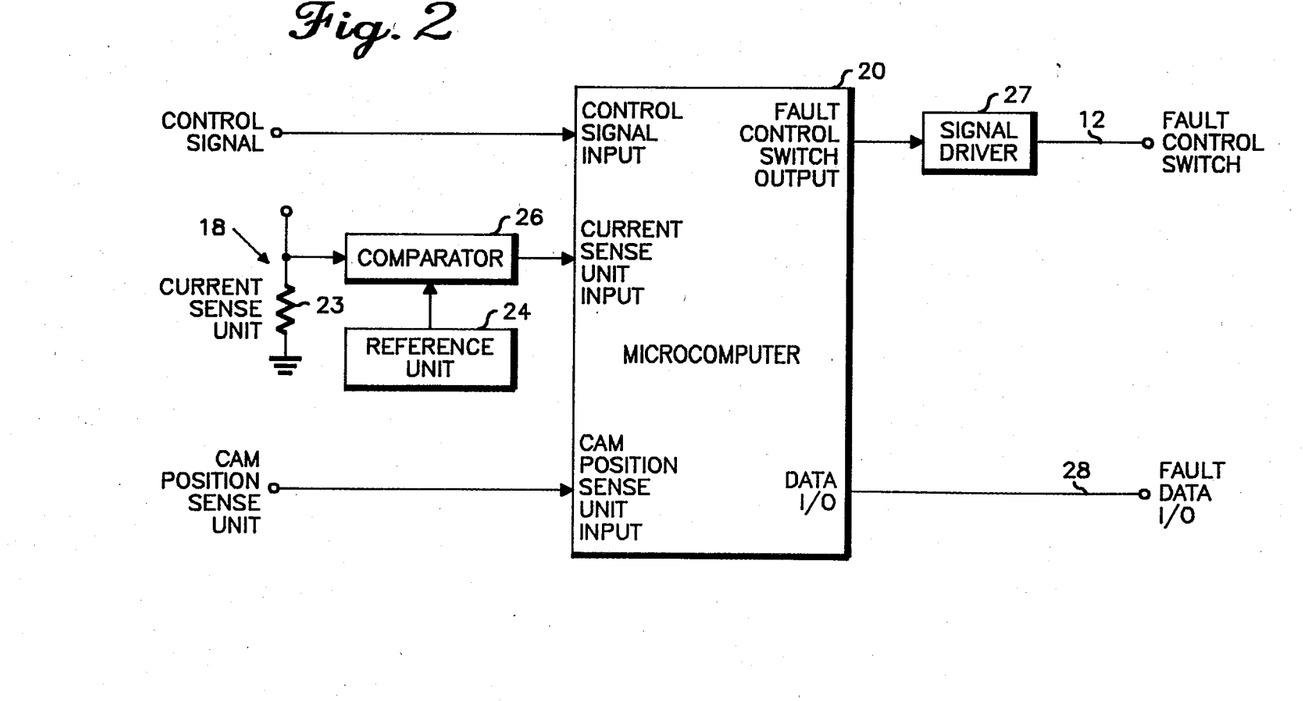
FIG. 2 comprises a more detailed block diagram view of the device.

Referring now to FIG. 2, the fault detect and protection unit (11) can be comprised of a microcomputer (20) such as the MC6801 as manufactured by Motorola, Inc. The microcomputer (20) has a control signal input for receiving control signals from the control unit and a CAM position sense input for receiving CAM position signals. The microcomputer (20) also includes a current sense unit input for receiving current sense unit information from the current sense unit (18) as may be obtained by comparing the voltage across a current sense resistor (23) with a reference signal from a reference unit (24) in a comparator (26).

The microcomputer (20) also provides a fault control switch output for issuing a fault control signal to the fault control switch (12) through a signal driver (27), and a data input/output port for providing fault data regarding fault conditions. With momentary reference to FIG. 1, this fault data signal can be provided to the control unit (13) via a fault data line (28) as may be desired.

Figure 3A:
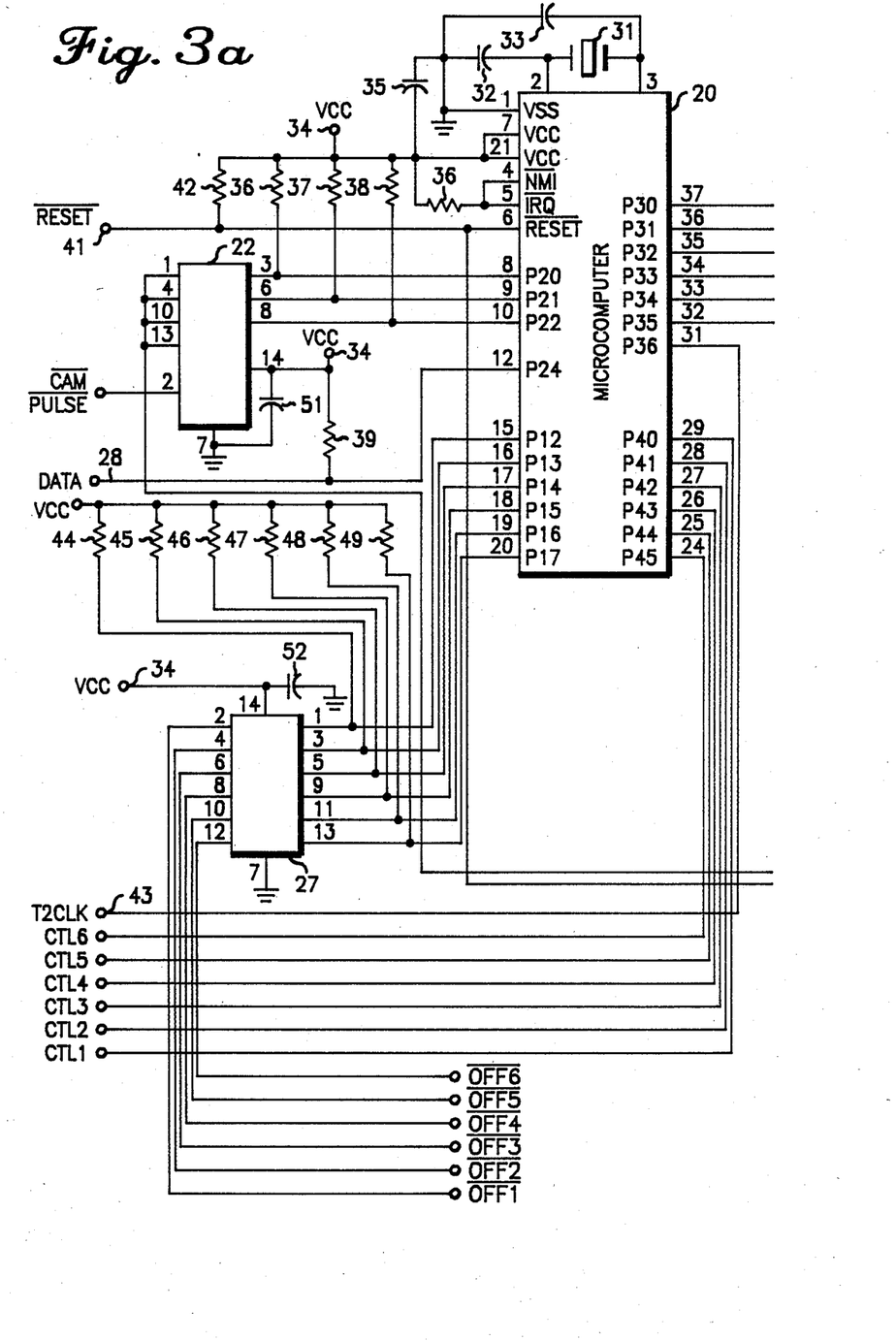
FIG. 3a-b comprises a schematic diagram of the device.
Figure 3B:
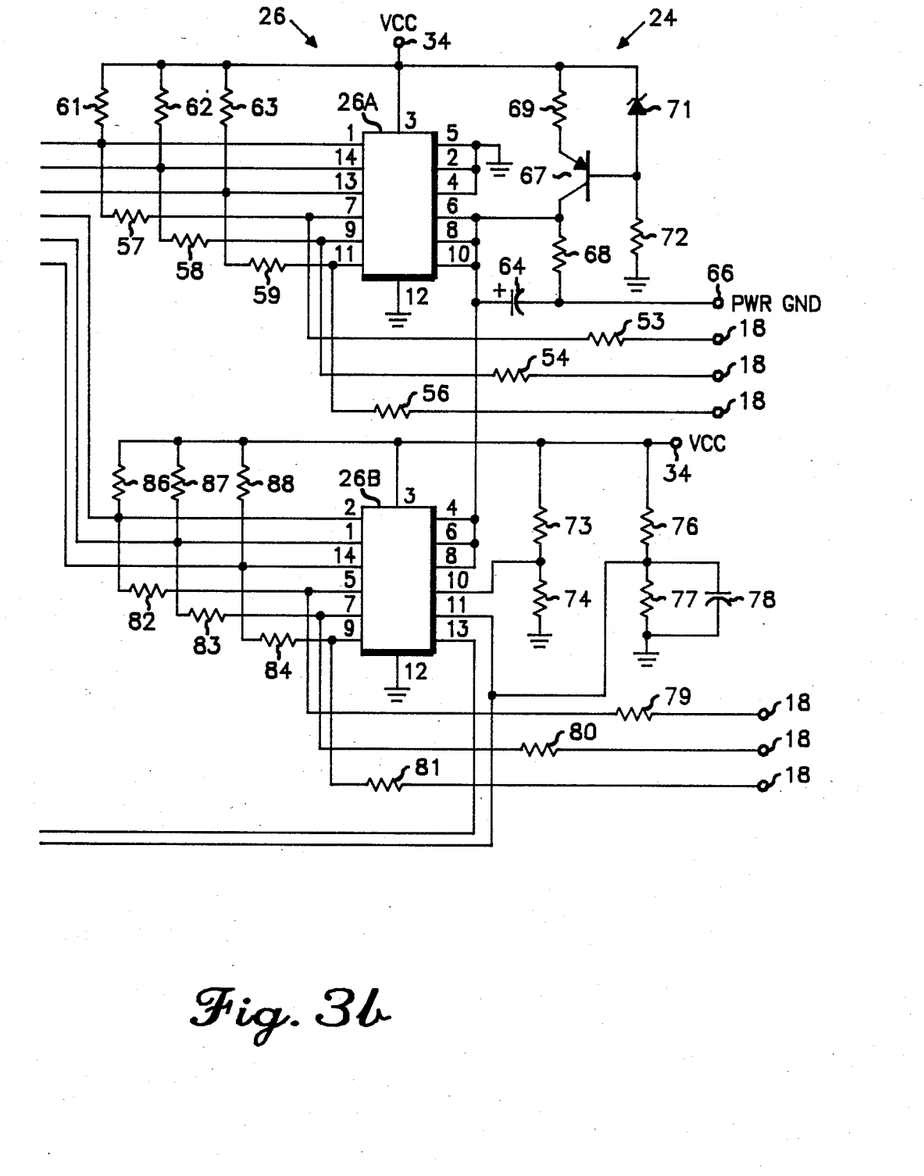

Referring now to FIGS. 3a-b, a more detailed description of the fault detect and protection unit (11) will be provided.

The fault detect and protection unit (11) includes generally a microcomputer (20), a buffer (22) (as provided through use of a 74HC126), a signal driver (27) (as provided through use of a 5417), and two comparator integrated circuits (26a and 26b) (both as provided through use of LM2901's).

Pins 2 and 3 of the microcomputer (20) have a 4 megahertz crystal (31) connected therebetween. Pin 2 also connects to ground through a 22 picofarad capacitor (32) and pin 3 similarly connects to ground through a second 22 picofarad capacitor (33).

The $V_{SS}$ port (pin 1) connects to ground. The two $V_{CC}$ ports (pin 7 and 21) connect to a 5 volt $V_{CC}$ source (34), and to ground through a 0.1 microfarad capacitor (35). The $\overline{NMI}$ and $\overline{IRQ}$ ports (pins 4 and 5) are coupled together, and through a 3.3 K ohm resistor (36) to $V_{CC}$ (34).

The Timer In, Timer Out, and Serial Communications Clock ports (pins 8, 9 and 10) of the microcomputer (20) each connect to a 10K ohm pull up resistor (36, 37 and 38, respectively) and to the buffer (22) (pins 3, 6 and 8, respectively). The Serial Communications Output port (pin 12) connects to a 10K ohm pull up resistor (39) and to the fault data signal line (28) referred to above with respect to FIGS. 1 and 2.

A $\overline{RESET}$ line (41) connects to an 82 ohm ½ watt pull up resistor (42) and to the $\overline{RESET}$ port (pin 6) of the microcomputer (20).

Pins 31 through 37, as configured, comprise an input bus that connects to the comparators (26a and 26b) and to a clock input line (43) (as described in more detail below) to receive the current sense signals described above. Pins 24 through 29 comprise a non-multiplexed address bus that are configured to receive the control signals as transmitted by the control unit (13) to the injector driver unit (14) to cause its activation. Finally, pins 15 through 20 comprise input/output lines that are each connected to a 10K ohm pull up resistor (44 through 49, respectively) and to the input pins (pins 1, 3, 5, 9, 11, and 13, respectively) of the signal driver (27) referred to above.

The buffer (22) referred to above has pin 14 connected to $V_{CC}$ (34) and to ground through a 0.1 microfarad capacitor (51). Pin 7 connects directly to ground. Pins 1, 4, 10 and 13 are coupled together and to pin 13 of one of the comparators (26b), which comparators will be described in more detail below. Finally, pin 2 connects to receive $\overline{CAM\ PULSE}$ signals from the CAM position sense unit (19) as generally referred to above.

The signal driver (27) has its input ports connected to the microcomputer (20) as described above. In addition, pin 7 connects to ground, and pin 14 connects to $V_{CC}$ (34) and to ground through a 0.1 microfarad capacitor (52). The output ports (pins 2, 4, 6, 8, 10, and 12) connect to the fault control switches (12) as described in more detail below and serve to provide the fault protect signal referred to above.

Referring now specifically to FIG. 3b, the comparators (26a and 26b) of the fault detect and protection unit (11) will be described in detail.

The first comparator (26a) has pins 7, 9 and 11 coupled through 1K ohm resistors (53, 54, and 56, respectively) to the current sense units (18) for receiving the current sense signals. These same ports (pins 7, 9 and 11) also connect through 18K ohm resistors (57, 58 and 59, respectively) to pins 1, 14, and 13, respectively.

Pins 1, 14, and 13 also connect to 6.8K ohm pull up resistors (61, 62 and 63, respectively) and to pins 37, 36, and 35 of the microcomputer (20). Pin 3 connects to $V_{CC}$ (34). Pins 5, 2, 4, and 12 connect to ground.

Referring now to the reference unit (24), pins 6, 8 and 10 are coupled together and connect: (a) through a 22 microfarad electrolytic capacitor (64) to a power ground (66); and (b) to the collector of a transistor (67).

The collector of this transistor (67) connects through a 390 ohm resistor (68) to the power ground (66). The emitter of this transistor (67) connects through a 4.7K ohm resistor (69) to $V_{CC}$ (34). The base of this transistor (67) connects to ground through a 5.6K ohm resistor (72) and to $V_{CC}$ through a 3.6 volt Zener diode (71).

With continued reference to FIG. 3b, the second comparator unit (26b) has pins 4, 6, and 8 connected to the collector of the above mentioned transistor (67). Pin 3 connects to $V_{CC}$ (34). Pin 12 connects to ground. Pin 10 connects to a voltage divider comprised of a 3.3K ohm resistor (73) and a grounded 2.2K ohm resistor (74). Pin 11 connects to another voltage divider network comprising a 2.2K ohm resistor (76) and a parallel coupled and grounded 3.3K ohm resistor (77) and a 180 picofarad capacitor (78). Pin 11 also connects to receive the $\overline{RESET}$ signal from the $\overline{RESET}$ line (41) referred to above. Pin 13 connects to the buffer (22) described above.

Pins 5, 7, and 9 connect through 1K ohm resistors (79, 80, and 81, respectively) to the current sense units (18) described below for receiving the current sense signals. In addition, pins 5, 7, and 9 connect through 18K ohm resistors (82, 83, and 84, respectively) to pins 2, 1, and 14 respectively. Pins 2, 1, and 14 also connect through 6.8K ohm pull up resistors (86, 87, and 88, respectively) and to pins 34, 33, and 32 of the microcomputer (20) referred to above.

So configured, current sense signals from the current sense units (18) can be compared in the comparators (26a and 26b) with reference signals from the reference unit (24), with the resulting comparator outputs being provided to the microcomputer (20). The microcomputer (20) also receives direct control signal inputs from the control unit (13), which control signals are also provided to the injector driver unit (14) (as depicted in FIG. 1). Finally, the microcomputer (20) receives engine revolution data in the form of CAM degree position information as received and transmitted through the buffer (22).

In turn, the microcomputer (20) can provide a fault protect signal to the fault control switches (12) through the signal driver unit (27), and can provide fault data signals to any desired location through the fault data line serial link (28).

Figure 4:
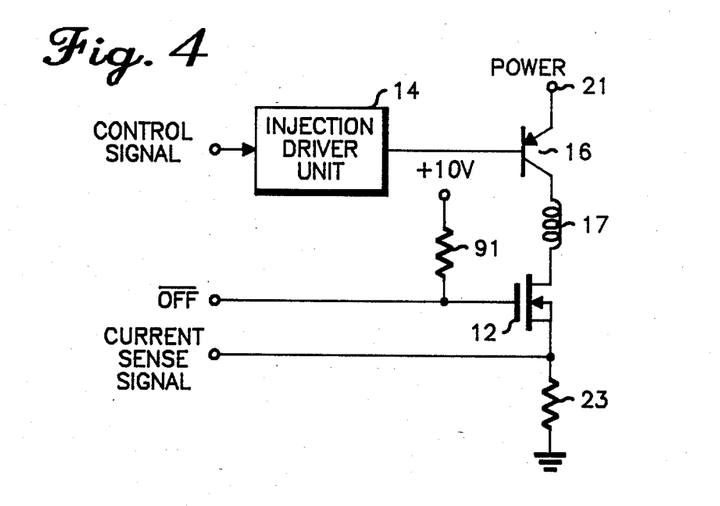
FIG. 4 comprises a schematic diagram of the fault control switch in combination with a typical electronically controlled fuel injection system.

Referring now to FIG. 4, the fault control switch (12) can be described. In ths embodiment, the fault control switch (12) can be provided through use of an MTM25N06 FET transistor (as manufactured by Motorola, Inc.) having its source and drain terminals connected in series with a fuel injector solenoid (17), and its gate coupled to receive the fault protect signals ($\overline{OFF}$) as transmitted by the microcomputer (20). In addition, a 200K ohm resistor (91) connects the gate to a positive 10 volt source. So configured, the transistor (12) will allow current to pass through the solenoid (17) in accordance with the conductive state of the current control switch (16) (represented here as a transistor). Upon issuance of a fault protect signal, however, the transistor (12) will open with respect to its power terminals and disrupt the current flow through the solenoid (17) regardless of the conductive state of the current control switch (16).

Figure 5:
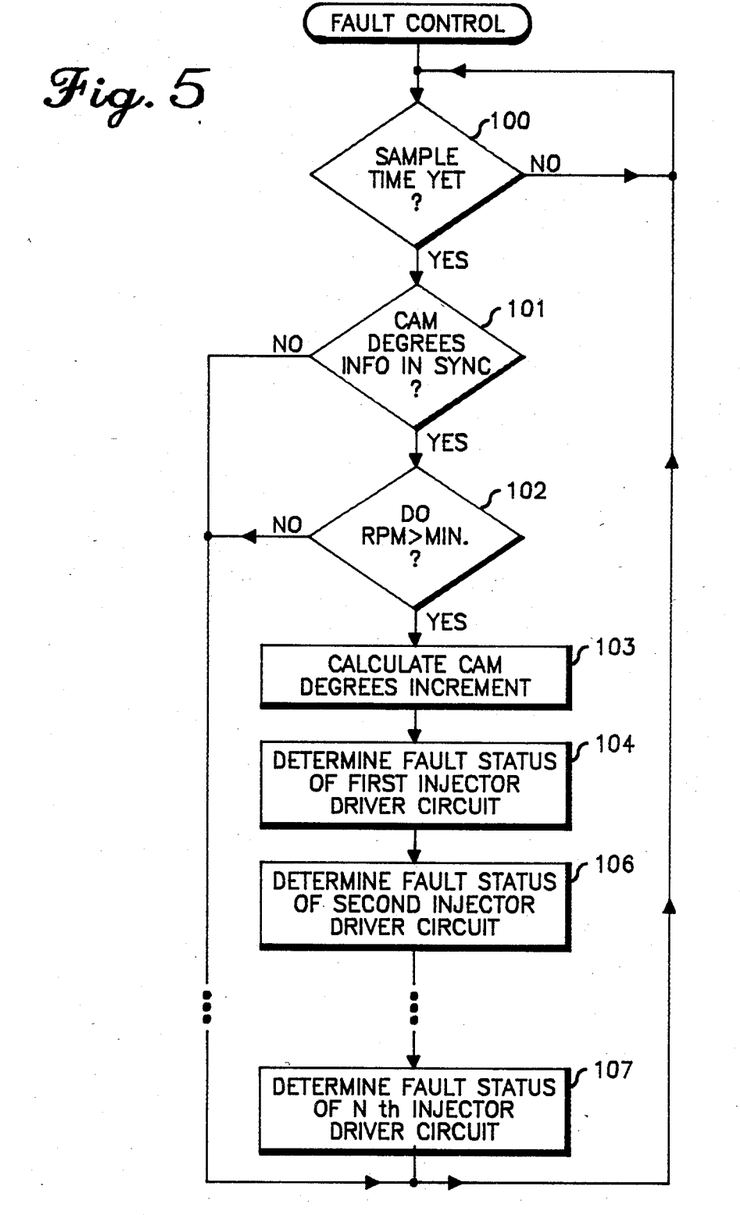
FIG. 5 comprises a flow chart depicting certain operating characteristics of the device.

The microcomputer (20) can be readily programmed to perform the functions described above. With reference to FIG. 5, a flow chart describing a general approach to these functions will now be delineated.

To begin, the microcomputer (20) will determine whether it is yet time to sample the fault status of the injector drivers (100). Any desired frequency for such periodic sampling can be selected as desired (the applicants have selected a sample rate of 1.3 milliseconds) to effectuate the desired performance criteria.

When the sampling time arrives, the microcomputer (20) will make a determination as to whether the engine rotation data in the form of CAM degrees information is in sync (101). If not, then no fault status inquiries should be made because any conclusions that result from such an inquiry would be suspect.

Presuming that the engine revolution data passes inspection, a second inquiry will be made to determine whether the engine revolutions per minute exceed some preselected minimum (102), such as 500 RPM. If they do not, then again fault status inquiries should be postponed because resulting conclusions could be unreliable.

Presuming this requirement to have been met or exceeded, the program may then calculate a specific CAM degrees increment representing the increase in CAM degrees from the last previous calculation (103). This information will be utilized elsewhere in the program. (A variety of ways are known in the art for calculating such information. The specific algorithm or technique utilized therefore need not be presented here, and for the sake of brevity will not be presented.) Following this, the microcomputer (20) can determine the fault status of the first injector driver circuit (104) in conjunction with the fault status subroutine discussed below. Upon concluding this inquiry, the next injector driver circuit can be similarly analyzed (106), until finally the last injector driver circuit has been inspected (107). In the particular embodiment described above with respect to FIG. 3a-b, up to six injector driver circuits can be monitored. The number of circuits monitored, of course, simply reflects a design consideration and will typically equal the number of combustion chambers in the engine to be controlled.

At the conclusion of this inquiry, the program can return to perform other functions or to repeat the sequence just described, as desired.

Figure 6:
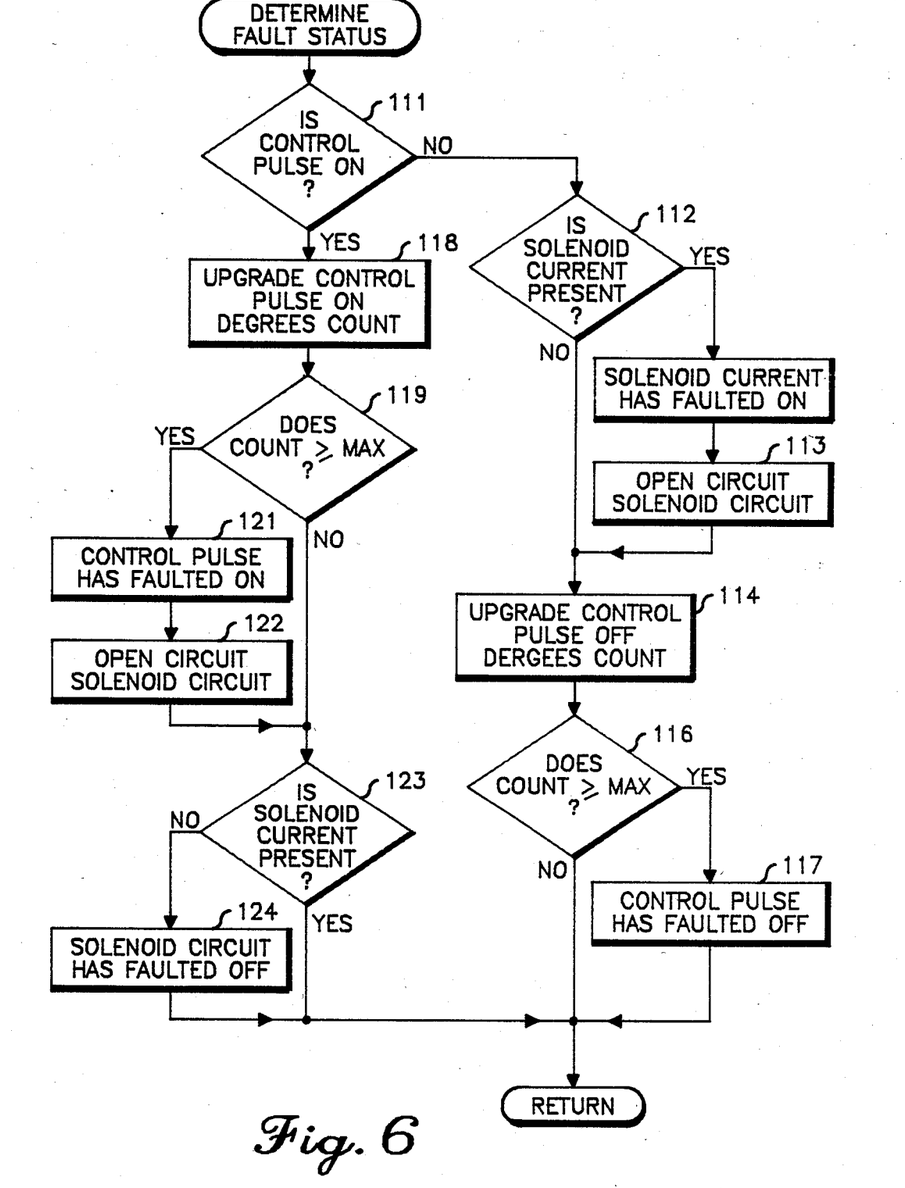
FIG. 6 comprises a flow chart depicting certain operating characteristics of the device.

Referring now to FIG. 6, a flow chart describing a fault status inquiry as useable with any of the injector driver circuits will now be described.

At the outset, the microcomputer (20) will consider the control signal inputs to determine the presence or absence of control pulse signals for the injector driver circuit under consideration (111). In the absence of such a signal, the microcomputer (20) will determine whether the solenoid (17) has current flowing through it by referring to the current sense input for that injector driver (112). If current can be sensed, this represents a fault condition, and the microcomputer (20) will respond by open circuiting the solenoid circuit (113) as described above by appropriate manipulation of the fault control switch (12).

Following this, or presuming that current cannot be sensed, the microcomputer (20) will upgrade a "control pulse off" degrees count (114). This count represents a count of CAM degrees during which the control signal has been continuously absent. Following this incremental upgrade, the microcomputer (20) will then determine whether this accumulated count equals or exceeds some preselected maximum (116). If it does not, the subroutine will return the microcomputer (20) to its ordinary process. If, however, the accumulated count does exceed the preselected maximum, the microcomputer (20) will conclude that the control pulse has faulted "off" (117), and this conclusion can be appropriately transmitted through the fault data signal line (28) for diagnostic and maintenance purposes.

Referring back to the original decision block (111), if the microcomputer (20) senses the presence of the control pulse, the program will incrementally increase a "control pulse on" degrees count (118). This count comprises a count of the accumulated CAM degrees during which the control pulse has been continuously present. Following this incremental increase, the microcomputer (20) will determine whether this accumulated count equals or exceeds a preselected maximum (119). If it does, the microcomputer (20) will conclude that the control pulse has faulted "on" (121), and will respond by open circuiting the solenoid circuit (122) as described above through appropriate manipulation of the fault control switch (12).

Following this, or in the event that the "control pulse on" degrees count does not equal or exceed the preselected maximum, the microcomputer (20) will make a determination as to whether the solenoid has current flowing therethrough (123). If it does not, then the microcomputer (20) can conclude that the solenoid circuit has faulted "off" (124) and an appropriate fault data signal can be transmitted via the fault data signal line (28) for appropriate diagnostic and maintenance purposes. Following this, or presuming that the solenoid does have current flowing therethrough, the subroutine will return the microcomputer (20) to its primary routine.

Through use of the injector driver fault detect and protection device described above, an electronically controlled fuel injection system can be rendered safer and more reliable. The dangerous conditions that can result through an unrestricted admission of fuel into the combustion chambers of an engine can be halted upon detecting an inappropriate control signal input or actual current flow through the solenoid. Other fault conditions that do not present the hazards of unrestricted fuel flow are similarly sensed and information regarding these faults made available to further diagnostic and maintenance functions.

Those skilled in the art will recognize that many modifications and variations can be made with respect to the above described embodiment without departing from the spirit of the invention. Therefore, the scope of this invention should not be considered as being limited to the specific embodiment set forth, except insofar as the claims may contain specific limitations directed to such features.

We claim:

1. In a fuel injection system having at least one fuel injection valve for use with an engine, at least one solenoid for controlling said fuel injection valve, a power line operably connected to said solenoid, control means for providing a control signal, injector driver means responsive to said control signal for providing a drive signal, and switch means having selectively variable conductive states and being responsive to said drive signal for selectively closing and opening said power line to thereby control said solenoid, an improvement comprising:

(a) current sense means for sensing current flow through said solenoid and for producing a current sense signal in response thereto;
    (b) fault detect means for receiving said current sense signal and said control signal for providing a fault protect signal when said current sense means provides said current sense signal and said control means does not substantially simultaneously provide said control signal; and
    (c) fault protect switch means responsive to said fault protect signal for preventing a flow of current through said solenoid.

2. The improvement of claim 1 wherein said fault protect switch means operates to selectively open and close said power line.

3. The improvement of claim 1 wherein said current sense means comprises a resistor.

4. The improvement of claim 3 wherein said resistor connects in series with said power line.

5. The improvement of claim 1 wherein said fault detect means further receives engine revolution data and functions to maintain a selective count related to said engine revolution data.

6. The improvement of claim 5 wherein said engine revolution data relates to CAM degrees.

7. The improvement of claim 5 wherein said fault detect means provides a fault data signal when said control signal has been absent longer than a predetermined count of said engine revolution data.

8. In a fuel injection system having at least one fuel injection valve for use with an engine, at least one solenoid for controlling said fuel injection valve, a power line operably connected to said solenoid, control means for providing a control signal, injector driver means responsive to said control signal for providing a drive signal, and switch means having selectively variable conductive states and being responsive to said drive signal for selectively closing and opening said power line to thereby control said solenoid, an improvement comprising:

(a) fault detect means for receiving;
        (i) said control signal; and
        (ii) engine revolution data from an engine used in conjunction with said fuel injection system; said fault detect means providing a fault protect signal when said control signal has been continuously in existence for too long in view of said engine revolution data; and
    (b) fault protect switch means responsive to said fault protect signal for preventing a flow of current through said solenoid.

9. The improvement of claim 8 wherein said fault protect switch means functions to selectively open and close said power line.

10. The improvement of claim 8 wherein said engine revolution data relates to CAM degrees.

11. The improvement of claim 10 wherein said "too long" criteria relates to a preselected specific number of CAM degrees.

12. The improvement of claim 8 and further including current sense means for sensing current flow through said solenoid and for producing a current sense signal in response thereto.

13. The improvement of claim 12 wherein said fault detect means further receives said current sense signal, and functions to provide a fault data signal if said fault detect means senses that a control signal is present and no current is substantially simultaneously flowing through said solenoid.

14. In a fuel injection system having at least one fuel injection valve for use with an engine, at least one solenoid for controlling said fuel injection valve, a power line operably connected to said solenoid, control means for providing a control signal, injector driver means responsive to said control signal for providing a drive signal, and switch means having selectively variable conductive states and being responsive to said drive signal for selectively closing and opening said power line to thereby control said solenoid, an improvement comprising:
 (a) current sense means for sensing current flow through said solenoid and for producing a current sense signal in response thereto;
 (b) fault detect means for receiving:
  (i) said current sense signal;
  (ii) said control signal; and
  (iii) engine revolution data; for providing
  (i) a fault protect signal when said current sense means provides said current sense signal and said control means does not substantially simultaneously provide said control signal; and
  (ii) a fault protect signal when said control signal has been in existence for too long in view of said engine revolution data; and
 (c) fault protect switch means responsive to said fault protect signal for preventing a flow of current through said solenoid.

15. The improvement of claim 14 wherein said fault detect means maintains a count related to said engine revolution data.

16. The improvement of claim 15 wherein said engine revolution data relates to CAM degrees.

17. The improvement of claim 16 wherein said "too long" criteria relates to a specific number of said CAM degrees.

18. The improvement of claim 16 wherein said fault detect means provides a fault data signal when said control signal has been absent greater than a predetermined count of said CAM degrees.

19. The improvement of claim 14 wherein said fault detect means provides a fault data signal if said fault detect means senses that said control signal is present and that substantially simultaneously therewith no current flows through said solenoid.

* * * * *